(12) United States Patent
Han

(10) Patent No.: US 7,691,748 B2
(45) Date of Patent: Apr. 6, 2010

(54) THROUGH-SILICON VIA AND METHOD FOR FORMING THE SAME

(75) Inventor: Kwon Whan Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 68 days.

(21) Appl. No.: 11/647,954

(22) Filed: Dec. 29, 2006

(65) Prior Publication Data

US 2008/0079121 A1    Apr. 3, 2008

(30) Foreign Application Priority Data

Sep. 30, 2006    (KR)    ............ 10-2006-0096718

(51) Int. Cl.
  *H01L 21/44* (2006.01)
(52) U.S. Cl. .................. 438/672; 438/629; 257/761
(58) Field of Classification Search ................ 438/675, 438/672; 257/621, 774
  See application file for complete search history.

(56) References Cited

U.S. PATENT DOCUMENTS 6,809,421 B1    10/2004    Hayasaka et al.

2003/0188888 A1 *  10/2003  Yoshioka et al. .......... 174/262
2006/0246711 A1 *  11/2006  Lehr et al. ................ 438/622
2007/0063353 A1 *   3/2007  Wen et al. .................. 257/777
2007/0158787 A1 *   7/2007  Chanchani ................ 257/619

FOREIGN PATENT DOCUMENTS

JP    2005-026405    1/2005

OTHER PUBLICATIONS

Machine translation of claims from JP-2005-026405.*
Machine translation of Detailed Description from JP-2005-026405.*
Machine translation of Drawings from JP-2005-026405.*
Machine translation of cover page from JP-2005-026405.*
Notice of Patent Grant mailed Jan. 10, 2008 for the corresponding KR10-2006-0096718.

* cited by examiner

*Primary Examiner*—Fernando L Toledo
*Assistant Examiner*—Mamadou Diallo
(74) *Attorney, Agent, or Firm*—Ladas & Parry LLP

(57) ABSTRACT

A method for forming a through-silicon via includes the steps of defining a groove in each chip of a wafer which has a plurality of semiconductor chips; applying liquid polymer on the wafer to fill the groove; forming an insulation layer on a sidewall of the groove through patterning the polymer; forming a metal layer to fill the groove which is formed with the insulation layer on the sidewall thereof; and back-grinding a backside of the wafer to expose the metal layer filled in the groove.

6 Claims, 4 Drawing Sheets

THROUGH-SILICON VIA AND METHOD FOR FORMING THE SAME

CROSS-REFERENCE TO RELATED APPLICATIONS

The present application claims priority to Korean patent application number 10-2006-0096718 filed on Sep. 30, 2006, which is incorporated herein by reference in its entirety.

BACKGROUND OF THE INVENTION

The present invention relates to a stack package, and more particularly to a through-silicon via for connection of stacked chips and a method for forming the same.

Packaging technology for an integrated circuit has continuously been developed to meet the demand toward miniaturization and mounting reliability. Recently, as the miniaturization and high functionality of electric/electronic products are required, various techniques have been disclosed in the art.

The term "stack" in the semiconductor industry means a vertical stand or pile of at least two chips or packages, one atop the other. By using a stack, in the case of a memory device for example, it is possible to produce a product having a memory capacity which is two times greater than that obtainable through semiconductor integration processes. Also, a stack package provides advantages not only through an increase in memory capacity but also in view of a mounting density and mounting area utilization efficiency. Due to this fact, researches and development for a stack package have been accelerated.

As an example of a stack package, a through-silicon via (TSV) has been disclosed in the art. The stack package using a TSV has a structure in which the TSV is formed in a chip so that chips are physically and electrically connected with each other through the TSV. A method for forming the TSV is as described below.

A vertical hole is defined through a predetermined portion of each chip at a wafer level. An insulation layer is formed on the surface of the vertical hole. With a seed metal layer formed on the insulation layer, an electrolytic substance, that is, a metal is filled into the vertical hole through an electroplating process to form a TSV. Then, the TSV is exposed through back-grinding of the backside of a wafer.

After the wafer is sawed and is separated into individual chips, at least two chips can be vertically stacked, one atop the other, on one of the substrates using one or more of the TSV. Thereupon, the upper surface of the substrate including the stacked chips is molded, and solder balls are mounted on the lower surface of the substrate, by which the manufacture of a stack package is completed.

In this type of stacked package using a TSV, when filling the vertical hole, in order to prevent the diffusion of the electrolytic substance, the insulation layer is formed on the surface of the vertical hole.

It is the norm that the insulation layer uses an oxide layer, which is formed through a high-temperature dry oxidization and wet oxidization processes or a nitride layer. The oxide layer formed through the high-temperature dry oxidization and wet oxidization processes or the nitride layer is relatively expensive. Also, while a proper thickness is required to secure an insulation characteristic, when considering the size of the vertical hole, it is difficult to secure a thickness for obtaining a satisfactory insulation characteristic. In addition, since the layer must be formed in the vertical hole, it is difficult to obtain uniformity and low roughness.

Moreover, the oxide layer formed through the high temperature dry oxidization and wet oxidization processes or the nitride layer is difficult to compensate for a difference in mechanical characteristic between the electrolytic substance in the vertical hole and silicon. As is known, a semiconductor chips generate heat while operating. Different thermal expansion coefficients between silicon and a metal or metallic substance can causes stresses in a semiconductor chip as its temperature rises and falls during operation, which is a phenomena that can significantly deteriorate the integrity and hence the reliability of silicon/metal junctions in a chip during the operation of the semiconductor chip. As a consequence, if the insulation layer cannot relieve the fatigue caused due to the difference in thermal expansion coefficient, displacements of respective materials vary when operation temperature is changed, and a fatigue is caused, by which fracture of a package may result. In this regard, the oxide layer or the nitride layer cannot appropriately relieve the fatigue caused due to the difference in thermal expansion coefficient between materials, as a result of which the fracture of the package may not be avoided.

Furthermore, in the oxide layer formed through the high temperature dry oxidization and wet oxidization processes or the nitride layer, when a defect is produced therein, a crack starting from the defect can be easily propagated into silicon, thereby causing a defect in a chip.

SUMMARY OF THE INVENTION

The present invention is directed to a TSV which can reduce the cost of forming an insulation layer in the manufacture of a stack package using the TSV, and a method for forming the same.

Also, the present invention is directed to a TSV which can secure an insulation characteristic of an insulation layer in the manufacture of a stack package using a TSV, and a method for forming the same.

Further, the present invention is directed to a TSV which can secure uniformity and low roughness of an insulation layer in the manufacture of a stack package using a TSV, and a method for forming the same.

Still, the present invention is directed to a TSV which can secure an excellent mechanical characteristic of an insulation layer in the manufacture of a stack package using a TSV, and a method for forming the same.

Additionally, the present invention is directed to a TSV which can prevent a defect from being caused in a semiconductor device due to the flaw of an insulation layer in the manufacture of a stack package using a TSV, and a method for forming the same.

In one embodiment, a through-silicon via includes a vertical hole defined through a chip, an insulation layer formed on a surface of the vertical hole, and a metal layer filled in the vertical hole, wherein the insulation layer is made of polymer having mechanical compliance.

In another embodiment, a method for forming a through-silicon via, comprising the steps of defining a groove in each chip of a wafer which has a plurality of semiconductor chips; applying liquid polymer on the wafer to fill the groove; forming an insulation layer on a sidewall of the groove through patterning the polymer; forming a metal layer to fill the groove which is formed with the insulation layer on the sidewall thereof; and back-grinding a backside of the wafer to expose the metal layer filled in the groove.

The step of defining a groove comprises the sub steps of forming on the wafer a photoresist pattern for exposing through-silicon via forming regions of each chip; etching exposed portions through using the photoresist pattern as an etch mask; and removing the photoresist pattern.

The patterning of the polymer is conducted through a photolithographic process. Alternatively, the patterning of the polymer is conducted in such a way as to expose and develop the polymer or to remove a portion of the polymer using a laser.

The step of forming a metal layer comprises the sub steps of depositing a seed metal layer in the groove including the insulation layer and on the wafer; forming on the seed metal layer deposited on the wafer a photoresist pattern for exposing the groove and surrounding portions of the seed metal layer; plating a metal layer on exposed portions of the seed metal layer through an electroplating process; and removing the photoresist pattern.

DETAILED DESCRIPTION

Figure 1A:
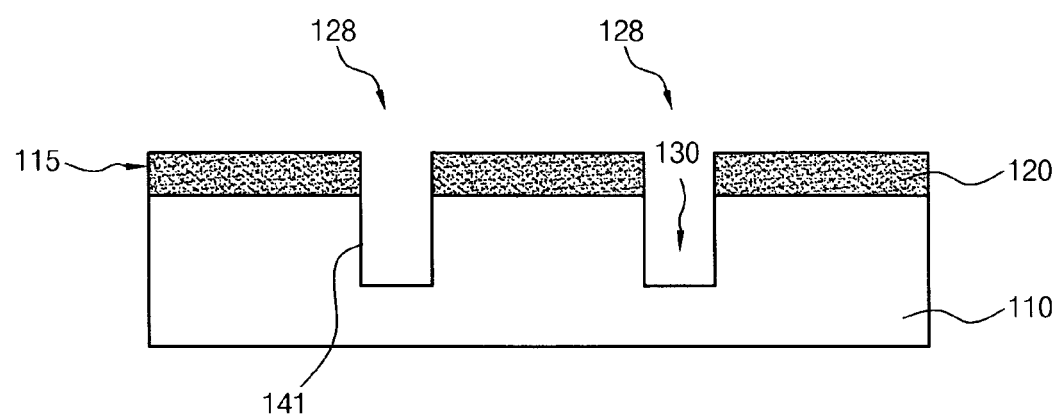
FIGS. 1A through 1G are cross-sectional views illustrating process steps of a method for forming a through-silicon via in accordance with an embodiment of the present invention. They also depict the structure of a semiconductor device formed to have a through-silicon via.

In the present invention, a relatively flexible polymer which adheres to both the surface of a silicon through-hole but also to a metal or metallic substance that is deposited over the polymer coating a silicon surface, provides a flexible, mechanical interface between silicon and a metal or metallic filler, which can accommodate variations in thermal expansion coefficients between silicon and the metal or metallic substance to provides improved mechanical compliance. The polymer also forms an insulation layer between silicon and an electrolytic or metallic substance. Such a polymer is referred to herein as a polymer that has "mechanical compliance" or which is "mechanically compliant." That is to say, in the present invention, after filling a vertical hole defined for forming a vertical connection with liquid polymer, through patterning the polymer to a desired shape using a photolithography process, an insulation layer is formed.

In this case, since the liquid polymer is applied by a method such as spin coating, etc., in the present invention, it is possible to reduce the cost of forming the insulation layer when compared to the conventional art in which the insulation layer is formed by an oxide layer or a nitride layer. Also, in the present invention, due to the fact that the insulation layer is formed by patterning polymer after filling the entire vertical hole using liquid polymer, the uniform thickness and low roughness of the insulation layer can be secured, and an adequate thickness for obtaining a satisfactory insulation characteristic can be secured.

A polymer is a substance that is mechanically flexible and softer or more pliable than an oxide layer or a nitride layer used as the insulation layer in the prior art. Therefore, in the present invention, by using a polymer between silicon and an electrolytic or metallic layer, it is possible to significantly reduce or even eliminate the fatigue fractures caused by a difference in thermal expansion coefficient between silicon and a metal. In other words, silicon and a metal undergo thermal expansion by the heat generated while a semiconductor chip operates, and as a result, a mechanical stress is produced. In this regard, because the polymeric insulation layer interposed between the silicon and the metal, is a relatively soft and flexible polymer having mechanical compliance, the polymer absorbs and dissipates the mechanical stress. Fracture of a package due to a fatigue can therefore be reduced.

In the oxide layer or the nitride layer which is used as the insulation layer in the conventional art, a crack starting from a defect produced therein is propagated into the silicon and causes a chip substrate or wafer to fracture. However, in the present invention, because the polymer is flexible, even when a defect is produced in the polymer, a crack is not propagated into the silicon. Therefore, using the present invention, the fracture of a chip due to the flaw of the insulation layer can be substantially prevented.

FIGS. 1A through 1F are cross-sectional views illustrating process steps of a method for forming a through-silicon via in accordance with an embodiment of the present invention.

Referring to FIG. 1A, a photoresist layer is applied on a wafer 110, which can be used to make several semiconductor chips having through-silicon vias or "TSV" forming regions. Through conducting exposure and development processes for the photoresist layer 115, a first photoresist pattern 120 for exposing the TSV forming regions is formed on each chip. By etching the exposed TSV forming regions 128 using the first photoresist pattern 120 as an etch mask, one or more slots, holes or grooves 130, are defined and formed by etching as shown in FIG. 1A. As used herein, the terms "groove" and "grooves" should be construed to mean and include slots, grooves and holes, whether they extend part way through the wafer 110, or completely through the wafer 110.

Figure 1B:
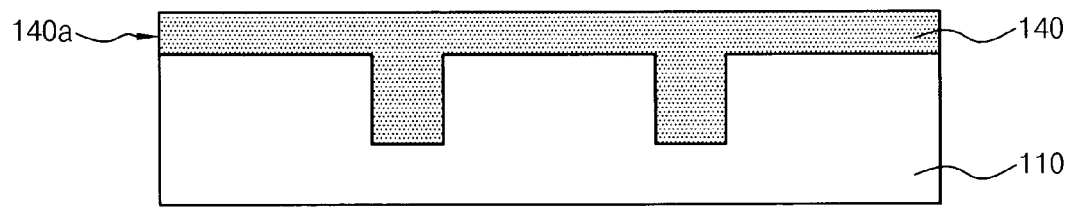

Referring to FIG. 1B, after the first photoresist pattern 120 is used as an etch mask, it is removed by conducting a conventional process, such as $O_2$ plasma etching Then, a liquid polymer 140 is applied on the wafer 110 including the grooves 130 in the silicon wafer 110, as a material that forms an insulation layer 140a. The liquid polymer 140 is applied through processes, such as spin coating, which can be easily conducted and requires a process cost typically less than that required in an oxidization process.

Figure 1C:
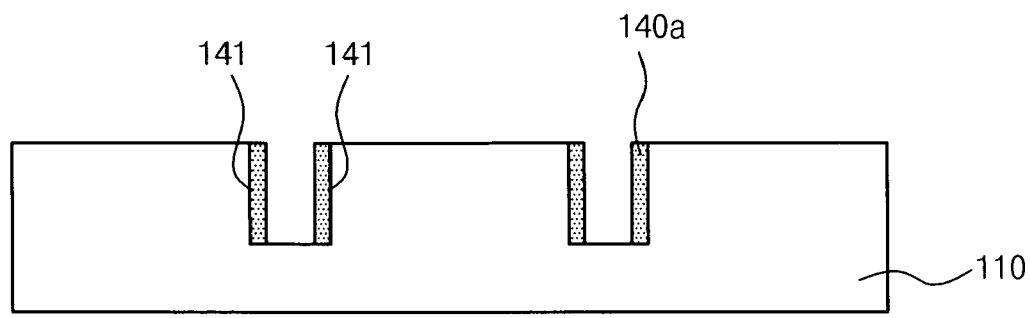

Referring to FIG. 1C, through patterning the liquid polymer 140 applied in the grooves 130 in the silicon wafer 110, a polymer insulation layer 140a is formed, i.e., left remaining on the surface of the sidewall 141 of each groove 130 in the silicon wafer 110. Here, the patterning of the polymer 140 is conducted through a separate photolithographic process or, by exposing a photosensitive polymer to light in order to develop and thereby effectively remove such a polymer 140. The patterning of the polymer 140 can also be conducted by ablating a predetermined portion of the polymer 140 using a laser.

Figure 1D:
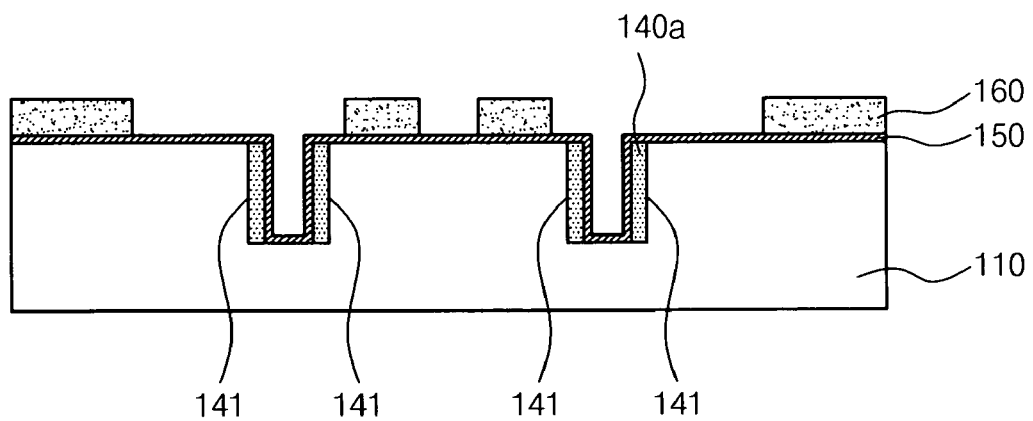
Figure 1E:
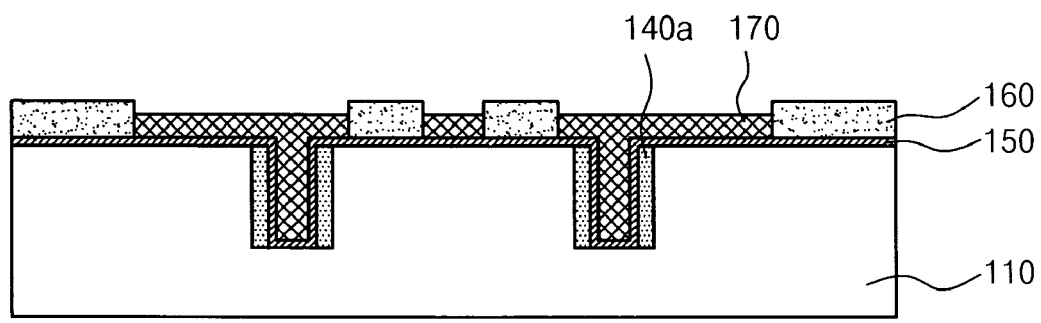

Referring to FIG. 1D, a thin film seed metal layer 150 is deposited on the wafer 110, including the polymer insulation layer 140a formed on the sidewall 141 of each groove 130. Next, a second photoresist pattern 160 for defining metal layer forming regions is formed on the seed metal layer 150. The second photoresist pattern 160 is formed to expose the grooves 130 and areas surrounding the grooves 130. As shown in FIG. 1E, using a process such as electroplating, a metal layer 170 is plated onto portions of the seed metal layer 150, which are exposed through the second photoresist pattern 160.

Still referring to FIG. 1E, the second photoresist pattern 160 used as a resist is removed through a conventional process. In succession, the portions of the seed metal layer 150, which are exposed due to the removal of the second photoresist pattern 160, are also removed.

Figure 1F:
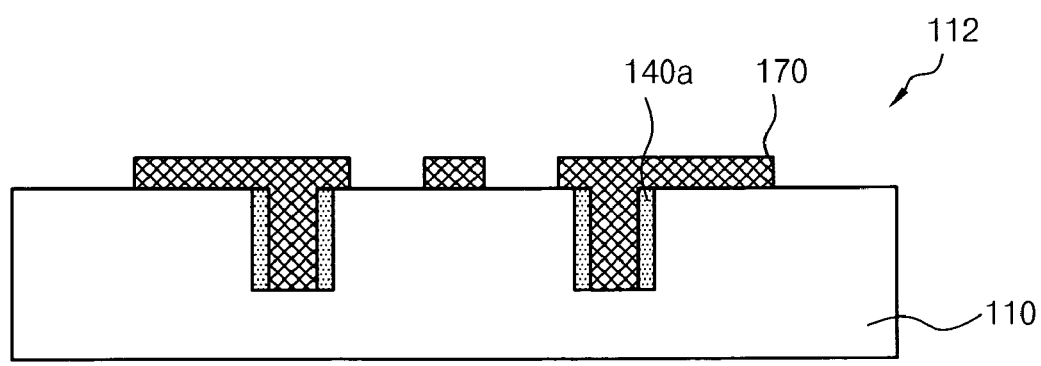
Figure 1G:
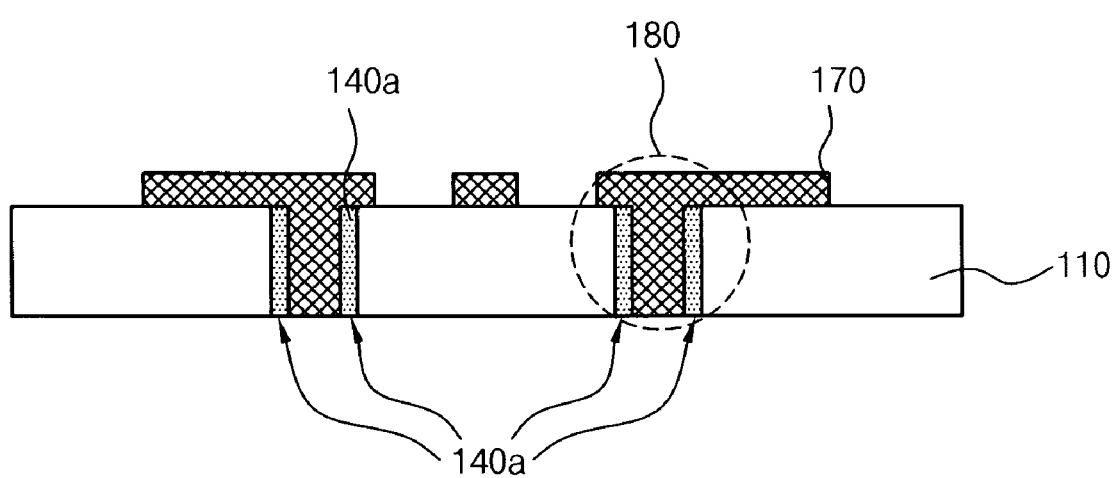

Referring to FIG. 1F, the backside 112 of the wafer 110 is back-grinded so that the metal layer 170 filled in the groove 130 is exposed. In this way, as shown in FIG. 1G, a TSV 180 having a structure in which polymer 140a is interposed between the silicon of the wafer 110 and the metal 170. The polymer 140a acts as both an insulation layer and as a thermal stress absorber.

As is apparent from the above description, the through-silicon via 180 and the method for forming the same according to the present invention provide advantages in that, since an insulation layer 140a interposed between silicon and an electrolytic substance when forming a TSV 180 used for vertically stacking chips is made of an appropriate polymer, the cost of forming an insulation layer 140a can be reduced when compared to the prior art, in which the insulation layer comprises an oxide layer or a nitride layer. It is also possible to form an insulation layer having a uniform thickness and low roughness. In addition, an insulation characteristic can be secured, and an excellent mechanical characteristic can be secured whereby the fatigue fracture of a package can be prevented. As a result, the reliability of a stack package using a TSV can be improved.

In the drawings and specification, there has been disclosed a specific embodiment of the invention and, although specific terms are employed, they are used in a generic and descriptive sense only and not for purposes of limitation, the scope of the invention being set forth in the following claims.

What is claimed is:

1. A method for forming a through-silicon via in a semiconductor wafer, said method comprising the steps of:

defining a groove in a wafer, said wafer capable of forming a plurality of semiconductor chips;

applying a liquid polymer onto the wafer to fill the groove and to cover an upper surface of the wafer by a process including spin coating;

removing at least part of the polymer filled in the groove and all of the polymer covering the upper surface of the wafer such that a portion of a bottommost surface of the groove is exposed so as to form an insulation layer on a sidewall of the groove through patterning the polymer;

applying a metal to fill the groove, which includes an insulation layer on a sidewall; and back-grinding a backside of the wafer to expose the metal layer filled in the groove, wherein the insulation layer formed on the sidewall of the groove provides a flexible mechanical interface between the sidewall of the groove and the metal filling the groove such that the insulation layer can accommodate variations in thermal expansion coefficients between the wafer having the groove and the metal filling the groove.

2. The method as set forth in claim 1, wherein the step of defining a groove includes the steps of:

forming on the wafer, a photoresist pattern for exposing a through-silicon via forming region on at least one chip;

etching exposed portions, using the photoresist pattern as an etch mask; and removing the photoresist pattern.

3. The method as set forth in claim 1, wherein the step of patterning the polymer uses a photolithographic process.

4. The method as set forth in claim 1, wherein the step of patterning of the polymer includes the step of exposing and developing a photosensitive polymer.

5. The method as set forth in claim 1, wherein the patterning of the polymer removes a portion of the polymer using a laser.

6. The method as set forth in claim 1, wherein the step of forming a metal layer comprises the sub steps of:

depositing a seed metal layer in the groove, which includes the insulation layer and on the wafer;

forming on the seed metal layer deposited on the wafer a photoresist pattern for exposing the groove and surrounding portions of the seed metal layer;

plating a metal layer on exposed portions of the seed metal layer through an electroplating process; and removing the photoresist pattern.

* * * * *